United States Patent
Zi et al.

(10) Patent No.: US 9,529,265 B2
(45) Date of Patent: Dec. 27, 2016

(54) METHOD OF PREPARING AND USING PHOTOSENSITIVE MATERIAL

(71) Applicant: Taiwan Semiconductor Manufacturing Company, Ltd., Hsin-Chu (TW)

(72) Inventors: An-Ren Zi, Hsinchu (TW); Chen-Hau Wu, New Taipei (TW); Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/310,656

(22) Filed: Jun. 20, 2014

(65) Prior Publication Data

US 2015/0316846 A1 Nov. 5, 2015

Related U.S. Application Data

(60) Provisional application No. 61/988,691, filed on May 5, 2014.

(51) Int. Cl.
| | |
|---|---|
| *G03F 7/26* | (2006.01) |
| *G03F 7/32* | (2006.01) |
| *G03F 7/039* | (2006.01) |
| *G03F 7/30* | (2006.01) |
| *G03F 7/004* | (2006.01) |
| *G03F 7/038* | (2006.01) |
| *G03F 7/11* | (2006.01) |
| *G03F 7/20* | (2006.01) |

(52) U.S. Cl.
CPC ............. *G03F 7/322* (2013.01); *G03F 7/0045* (2013.01); *G03F 7/0046* (2013.01); *G03F 7/039* (2013.01); *G03F 7/0382* (2013.01); *G03F 7/0392* (2013.01); *G03F 7/11* (2013.01); *G03F 7/2041* (2013.01); *G03F 7/30* (2013.01)

(58) Field of Classification Search
CPC ........................................................ G03F 7/26
See application file for complete search history.

(56) References Cited

U.S. PATENT DOCUMENTS

| | | | |
|---|---|---|---|
| 4,123,931 A | 11/1978 | Blaser | |
| 4,554,237 A | 11/1985 | Kataoka et al. | |
| 5,175,124 A | 12/1992 | Winebarger | |
| 5,853,961 A | 12/1998 | Sakai et al. | |
| 5,887,605 A | 3/1999 | Lee et al. | |
| 6,451,510 B1 | 9/2002 | Messick et al. | |
| 6,511,875 B2 | 1/2003 | Park et al. | |
| 6,594,847 B1 | 7/2003 | Krusell et al. | |
| 6,605,409 B2 | 8/2003 | Kodama et al. | |
| 6,613,499 B2 | 9/2003 | Chang | |
| 6,653,415 B1 | 11/2003 | Bottcher et al. | |
| 6,660,828 B2 | 12/2003 | Thomas et al. | |
| 6,753,071 B1 | 6/2004 | Pacetti | |
| 6,770,404 B1 | 8/2004 | Wheland et al. | |
| 6,818,148 B1 | 11/2004 | Watanabe et al. | |
| 6,824,621 B2 | 11/2004 | Shibagaki | |
| 6,844,135 B2 | 1/2005 | Kon et al. | |
| 6,849,293 B2 | 2/2005 | Rawat | |
| 6,964,840 B2 | 11/2005 | Nishimura et al. | |
| 7,189,493 B2 | 3/2007 | Hatakeyama et al. | |
| 7,232,771 B2 | 6/2007 | Jacobs et al. | |
| 7,511,169 B2 | 3/2009 | Ohsawa et al. | |
| 7,595,141 B2 | 9/2009 | Kudo et al. | |
| 7,678,527 B2 | 3/2010 | Meagley et al. | |
| 7,811,740 B2 | 10/2010 | Kanda et al. | |
| 7,951,722 B2 | 5/2011 | Ho | |
| 8,349,533 B2 | 1/2013 | Ohsawa et al. | |
| 8,476,003 B2 | 7/2013 | Lee et al. | |
| 8,518,634 B2 | 8/2013 | Yeh et al. | |
| 9,448,485 B2 | 9/2016 | Okayasu et al. | |
| 2001/0036725 A1 | 11/2001 | Chang | |
| 2005/0106498 A1 | 5/2005 | Cao et al. | |
| 2005/0202347 A1 | 9/2005 | Houlihan et al. | |
| 2006/0105272 A1 | 5/2006 | Gallagher et al. | |
| 2007/0122734 A1 | 5/2007 | Roberts et al. | |
| 2007/0134588 A1* | 6/2007 | Kanda | C07C 69/653 430/270.1 |
| 2007/0166640 A1* | 7/2007 | Wei | G03F 7/2041 430/270.1 |
| 2008/0156346 A1 | 7/2008 | Wang et al. | |
| 2008/0166667 A1 | 7/2008 | Goldfarb | |

(Continued)

FOREIGN PATENT DOCUMENTS

WO    WO-03-040827 A1    5/2003

OTHER PUBLICATIONS

"3M Material Safety Data Sheet FC-43 Fluorinert Brand Electronic Liquid," 3M Company, Apr. 26, 2005, 7 pgs.
"3M Material Safety Data Sheet FC-70 Fluorinert Brand Electronic Liquid," 3M Company, Mar. 13, 2007, 7 pgs.
"3M Material Safety Data Sheet FC-72 Fluorinert Brand Electronic Liquid," 3M Company, Apr. 26, 2005, 8 pgs.
"3M Material Safety Data Sheet FC-84 Fluorinert Brand Electronic Liquid," 3M Company, Mar. 23, 2007, 7 pgs.
"Material Safety Data Sheet 3M NOVEC 4200 Electronic Surfactant," 3M Company, Jan. 26, 2010, 8 pgs.

(Continued)

*Primary Examiner* — Kathleen Duda
(74) *Attorney, Agent, or Firm* — Haynes and Boone, LLP

(57) ABSTRACT

Provided in one embodiment is a method that includes selecting a photoresist that is one of a positive-tone photoresist and a negative-tone photoresist. A first additive or a second additive is selected based on the photoresist. The first additive has a fluorine component and a base component attached to a polymer and is selected if the a positive-tone resist is provided. The second additive has the fluorine component and an acid component attached to the polymer and is selected with a negative-tone resist is provided. The selected photoresist and the selected additive material are applied to a target substrate.

19 Claims, 10 Drawing Sheets

(56) References Cited

U.S. PATENT DOCUMENTS

| | | |
|---|---|---|
| 2008/0280230 A1 | 11/2008 | Chang et al. |
| 2008/0299487 A1 | 12/2008 | Chang |
| 2009/0205677 A1 | 8/2009 | Thakur et al. |
| 2011/0229829 A1 | 9/2011 | Chang |
| 2011/0294069 A1 | 12/2011 | Bae et al. |
| 2013/0034966 A1 | 2/2013 | Yeh et al. |
| 2013/0045606 A1 | 2/2013 | Yeh et al. |
| 2013/0302985 A1 | 11/2013 | Wu |
| 2014/0255850 A1 | 9/2014 | Chang |

OTHER PUBLICATIONS

"Material Safety Data Sheet 3M NOVEC 7500 Engineered Fluid," 3M Company, Feb. 19, 2010, 8 pgs.

"Material Safety Data Sheet 3M NOVEC Engineered Fluid HFE-7000," 3M Company, Apr. 17, 2009, 8 pgs.

"Material Safety Data Sheet 3M NOVEC Fluorosurfactant FC-4432," 3M Company, Apr. 8, 2009, 9 pgs.

"Material Safety Data Sheet 3M NOVEC Fluorosurfactant FC-4434," 3M Company, Apr. 8, 2009, 9 pgs.

Material Safety Data Sheet FC-40 Fluorinert Brand Electronic Liquid, 3M Company, Mar. 9, 2010, 8 pgs.

"Material Safety Data Sheet FC-77 Fluorinert Brand Electronic Liquid," 3M Company, Apr. 28, 2009, 8 pgs.

"NOVEC 4300 Electronic Surfactant," 3M Company, Sep. 2005, 4 pages.

"NOVEC Engineered Fluids for Wet Cleaning of Dry Etcher Parts," 3M Company, Jul. 2001, 4 pgs.

Dan Syverson; "Implant Stripping: Steam Injection for Uniform Wet Stripping;" 2010; Issue II; pp. 20-23; www.euroasiasemiconductor.com.

Manish Chandhok; Kent Frasure; E. Steve Putna; Todd R. Younkin; Willy Rachmady; Uday Shah and Wang Yueh; "Improvement In Linewidth Roughness by Postprocessing;" Nov./Dec. 2008; pp. 2265-2270; J. Vac. Sci. Technol. B 26(6); American Vacuum Society.

Yu-Chung Su et al., U.S. Appl. No. 14/537,347, "Lithography Process and Composition with D-Crosslinkable Crosslink Material," filed Nov. 10, 2014, 22 pages.

* cited by examiner

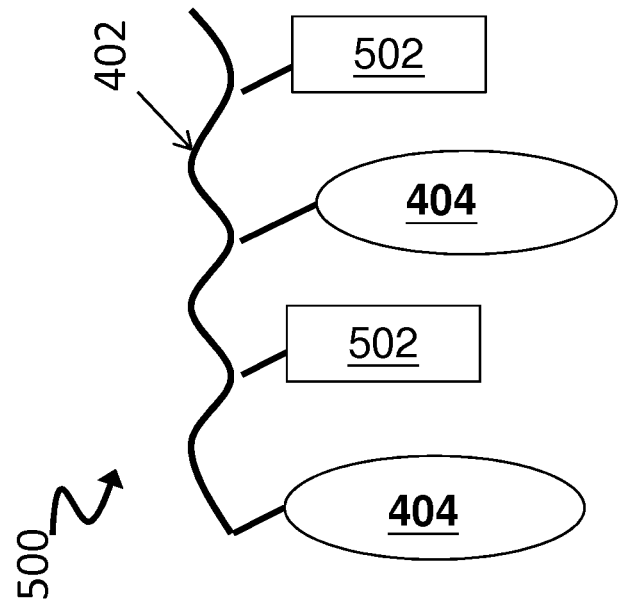
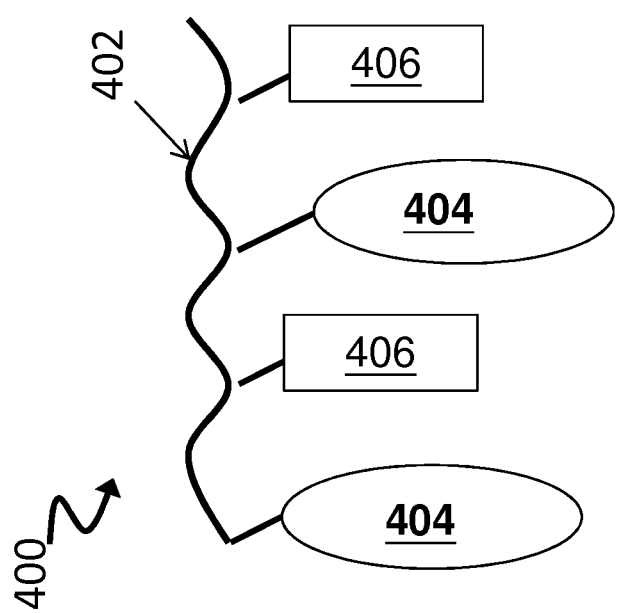

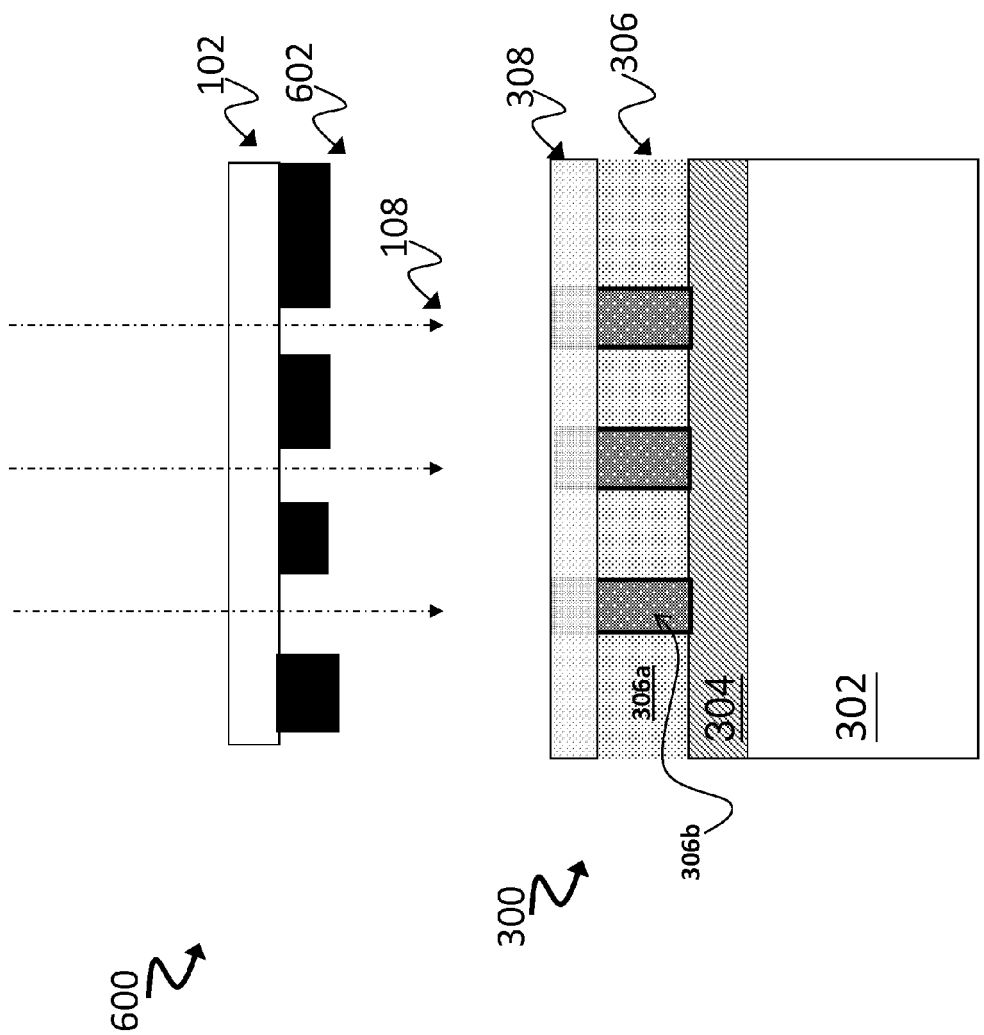

METHOD OF PREPARING AND USING PHOTOSENSITIVE MATERIAL

CROSS-REFERENCE TO RELATED APPLICATIONS

This application is a continuation application of U.S. Application No. 61/988,691, which was filed on May 5, 2014, the entire disclosure of which is incorporated herein by reference.

BACKGROUND

The semiconductor integrated circuit (IC) industry has experienced rapid growth. Technological advances in IC materials, design, and fabrication tools have produced generations of ICs where each generation has smaller and more complex circuits than the previous generation. In the course of these advances, fabrication methods, tools, and materials have struggled to realize the desire for smaller feature sizes.

Lithography is a mechanism by which a pattern is projected onto a substrate, such as a semiconductor wafer, having a photosensitive layer formed thereon. The pattern is typically induced by passing radiation through a patterned photomask. Important to today's lithography processes are their depth of focus (DOF) or the tolerance of placement of the image plane. One manner of improving the DOF in lithography processes, as well as other process window metrics, is providing reticle enhancement technique (RET) solutions such as scattering bars to the photomask. The resolution improvement provided by RET features such as scattering bars however raise other challenges. For example, as photosensitive materials become more sensitive to meet current radiation sources, this sensitivity can raises concerns of the unwanted printing of RET features onto the target substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4 and 5 are diagrammatic views of a polymer in accordance with some embodiments.

FIG. 6 is a cross sectional view of a photolithography process in accordance with some embodiments.

DETAILED DESCRIPTION

Figure 1:
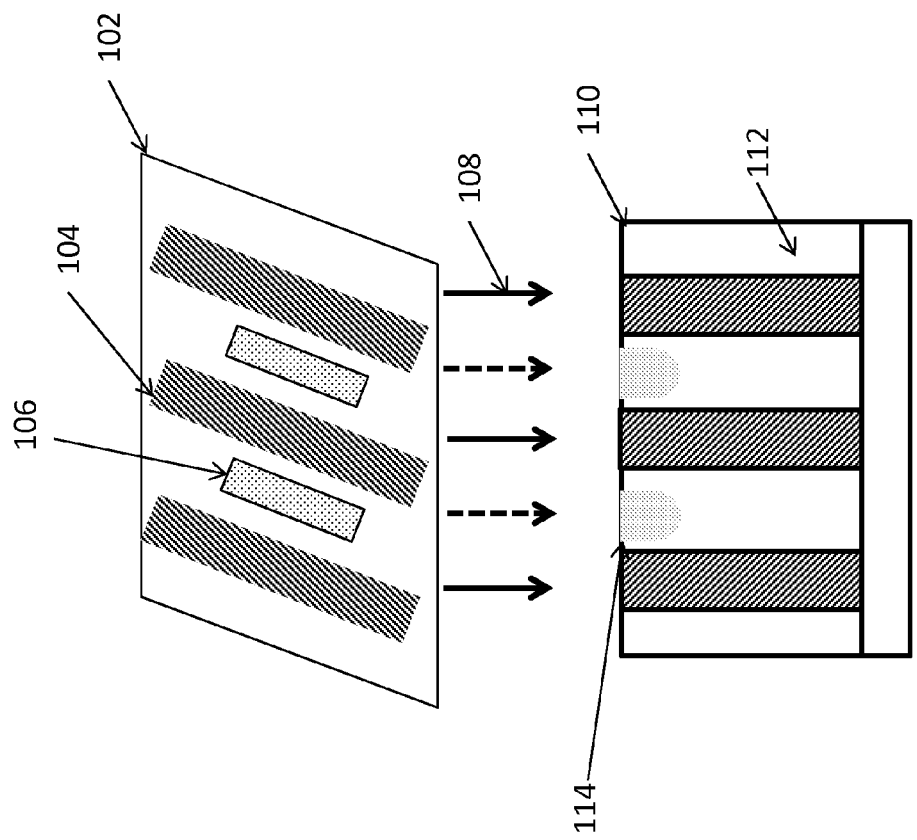
FIG. 1 illustrates a prior art photolithography process in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, illustrated is a photolithography system 100. The photolithography system 100 includes a photomask 102 having main features 104 and scattering bars 106. A radiation beam 108 is provided through the photomask 102. The photolithography system 100 further includes a target substrate 110 having a photosensitive layer 112 disposes thereon. Each of these elements is described in further detail below. These exemplary embodiments, including the exemplary photosystem 100 does not imply that any portion of the present disclosure is directed to a certain photolithography manner other than if specifically recited in the claims that follow. For example, though the photolithography system 100 illustrates a photomask having binary materials, there is no implication that the materials and methods discussed herein are limited to UV radiation, but may apply to e-beam lithography, other photomask types, immersion lithography, and/or other suitable methods. Similarly, though described herein as a photolithography method configured to fabricate semiconductor devices, any photolithography method or system may benefit from the disclosure including, for example, for TFT-LCD fabrication, and/or other photolithography processes known in the art.

The photomask 102 may include silica, fused quartz, calcium fluoride (CAF2), silicon carbide, silicon oxide-titanium oxide alloy or other suitable material known in the art. The main feature 104 may be a reflective, aborption, or opaque layer or multi-layer feature to pattern an incident radiation beam. The main feature 104 may include chromium (Cr), chromium oxide (CrO), titanium nitride (TiN), tantalum nitride (TaN), tantalum (Ta), titanium (Ti), aluminum copper (Al—Cu), palladium, tantalum boron nitride (TaBN), aluminum oxide (AlO), molybdenum (Mo) including Mo pained with silicon or beryllium, ruthenium and ruthenium compounds, and/or other suitable materials. The scattering bars 106 are sub-resolution, phase shift or chrome bar like features placed near the edges of the the main pattern features 104 on the photomask 102. The scattering bars 106 may provide for altering the printing of the main features 104, for example, improving or maintaining adequate depth of focus and dimension variations of the printed features.

Radiation 108 may be an ultraviolet light source, for example deep ultra-violet: a krypton fluoride (KrF, 248 nm), argon fluoride (ArF, 193 nm), F2 (157 nm), and extreme ultra-violet (EUV, 13.5 nm). The radiation is incident the photomask 102 and patterned by the photomask 102 and features formed thereon to form the patterned radiation beam 108, which is incident the target substrate 110.

The substrate 110 may be a semiconductor substrate (e.g., wafer). In an embodiment, the substrate 110 is silicon in a crystalline structure. In alternative embodiments, the substrate 110 may include other elementary semiconductors such as germanium, or includes a compound semiconductor such as, silicon carbide, gallium arsenide, indium arsenide, and indium phosphide. The substrate 110 may include a silicon on insulator (SOI) substrate, be strained/stressed for performance enhancement, include epitaxially grown regions, include isolation regions, include doped regions, include one or more semiconductor devices or portions thereof, include conductive and/or insulative layers, and/or include other suitable features and layers. In an embodiment, the substrate 110 includes antireflective coatings (ARC) (e.g., bottom ARC (BARC) or top ARC (TARC)), hard mask materials, and/or other target layers for patterning by the photosensitive layer 112.

The photosensitive layer 112 disposed on the substrate 110 may be a conventional positive or negative tone photoresist. Photosensitive materials such as layer 112 are typically used to pattern target layers, for example, provided on a semiconductor substrate, in order to form a device or portion thereof. One photosensitive material is chemical amplify photoresist or CAR. For some embodiments of a chemical amplify resist, a photoacid generator (PAG) will become an acid after exposure to radiation. The acid will initiate the leaving of acid labile groups (ALG) of the polymer during the post-exposure bake (PEB) process. The leaving of the ALG will produce an acid for initiating leaving of subsequent ALG from the polymer. Such a chain reaction will be terminated only when the acid produced comes in contact with a base, also referred to as a base quencher or simply quencher. When the ALG leaves the polymer of the resist, the branch unit of the polymer will be changed to carboxylic group that increases the polymer solubility to a positive tone developer; thus, allowing the irradiated area of the resist to be removed by a developer, while the non-irradiated area remains insoluble and becomes a masking element for subsequent processes (for the case of positive resist). The PAG and the quencher are typically provided in a solvent. Other types of resist, including negative resist, are possible.

One feature of some embodiments of the system 100 as illustrated in FIG. 1 is that the scattering bars 106 are sufficiently sized as to pattern the incident radiation beam providing an undesired exposed region 114 on the photosensitive material 110. As semiconductor main feature sizes shrink, this disadvantage to the system 100 becomes more apparent as the depth of focus (DOF) becomes more challenging. Scattering bars such as scattering bars 106 improve the DOF but as the photosensitive material such as element 110 becomes more sensitive for newly developed light sources, the scattering bars 106 are more likely to provide undesired printing onto the target surface, such as illustrated by region 114.

Figure 2:
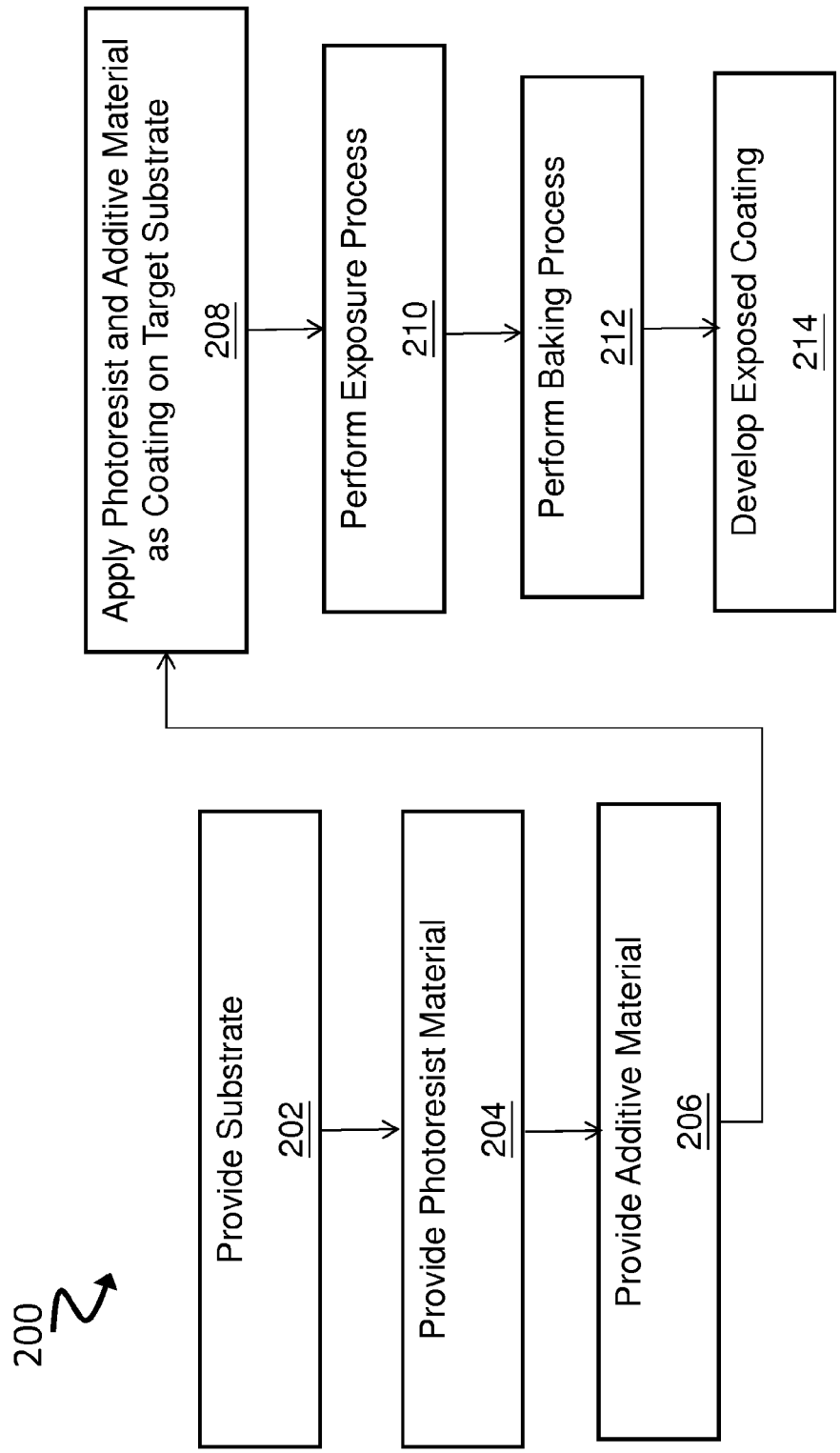
FIG. 2 is a flow chart of an embodiment of a method of preparing and using a photosensitive material in accordance with some embodiments.

Referring now to FIG. 2, illustrated is a flow chart of a method of preparing and using a photolithography material that may provide for a decrease in one or more issues illustrated above in the system 100 of FIG. 1. Aspects of the system 100 may be used to implement one or more steps of the method 200. The method 200 begins at block 202 where a target substrate is provided. The substrate may be a semiconductor substrate (e.g., wafer). In an embodiment, the substrate is silicon in a crystalline structure. In alternative embodiments, the substrate may include other elementary semiconductors such as germanium, or includes a compound semiconductor such as, silicon carbide, gallium arsenide, indium arsenide, and indium phosphide. The substrate may include a silicon on insulator (SOI) substrate, be strained/stressed for performance enhancement, include epitaxially grown regions, include isolation regions, include doped regions, include one or more semiconductor devices or portions thereof, include conductive and/or insulative layers, and/or include other suitable features and layers. In an embodiment, the substrate includes antireflective coatings (ARC) (e.g., bottom ARC (BARC) or top ARC (TARC)), hard mask materials, and/or other target layers for patterning by the photosensitive layer discussed below. In an embodiment, the substrate or portion thereof is substantially conductive with an electric resistance less than approximately $10^3$ ohm-meters. The substrate may include at least one metal, metal alloy, metal nitride/sulfide/selenide/oxide/silicide, for example, with the formula $MX_a$, where M is a metal and X is at least one of N, S, Se, O, and Si and where a is between approximately 0.4 and approximately 2.5. Exemplary compositions included on/in the substrate include Ti, Al, Co, Ru, TiN, $WN_2$, TaN, and other suitable materials. In an embodiment, the substrate includes a dielectric with a dielectric constant between approximately 1 and approximately 40. In a further embodiment, the substrate includes at least one of silicon, metal oxide, metal nitride, and/or other suitable materials. Exemplary compositions include $MX_b$ where M is a metal or silicon, X is N or O and b is between approximately 0.4 and approximately 2.5. Exemplary compositions include $SiO_2$, silicon nitride, aluminum oxide, hafnium oxide, and lanthanum oxide.

In an embodiment, the substrate is typical of a CMOS process technology. However, though processing a substrate in the form of a semiconductor wafer may be described, it is to be understood that other examples of substrates and processes may benefit from the present invention such as, for example, printed circuit board substrates, damascene processes, and thin film transistor liquid crystal display (TFT-LCD) substrates and processes. Referring to the example of FIG. 3, a target substrate 302 is provided. The target substrate 302 includes a first layer 304. The first layer 304 may be a hard mask layer, an anti-reflective layer, hexamethyldisilazane (HMDS), and/or other suitable layer. In an embodiment, the first layer 304 is a bilayer of BARC and an organic or inorganic (e.g., Si) layer.

The method 200 then proceeds to block 204 where a photosensitive material (also referred to as photoresist) is provided. The resist is a radiation (e.g., light) sensitive material and may be a positive tone resist (PTD) or negative tone resist (NTD). A positive tone resist (or simply positive resist) is a type of photoresist in which the portion of the photoresist that is exposed to light becomes soluble to the photoresist developer. The portion of the photoresist that is unexposed remains insoluble to the photoresist developer. A negative tone resist (or simply negative resist) is a type of photoresist in which the portion of the photoresist that is exposed to light becomes insoluble to the photoresist developer. The unexposed portion of the photoresist is dissolved by the photoresist developer.

Specifically, the photosensitive material may include an organic polymer (e.g., positive tone or negative tone photoresist polymer), an organic-based solvent, and/or other suitable components known in the art. Other components may include a photo acid generator (PAG) component, a thermal acid generator (TAG) component, a quencher component, a photo-decomposable base (PDB) component, and/or other suitable photosensitive component depending on the resist type. Exemplary organic based solvents include but are not limited to PGMEA (propylene glycol monomethyl ether acetate) (2-methoxy-1-methylethylacetate), PGME (propylene glycol monomethyl ether), GBL (gamma-butyrolacetone), cyclohexanone, n-butyl acetate, and 2-heptanone. The organic polymer resin of the photosensitive material may include those resists formulated for KrF, ArF, immersion ArF, EUV, and/or ebeam lithography processes. Examples include Novolak (a phenol formaldehyde resin), PHS (poly(4-hydroxystyrene) derivatives), poly aliphatic resist, phenolic derivative, and/or other suitable formulations.

After supplying the photoresist that may be now known or later developed and provided in block 204, the method 200 then continues to block 206 where an additive material is provided. The additive material is prepared according to one or more aspects of the present disclosure. The additive material may include a polymer having a plurality of floatable units and one of acid (PAG) or base (quencher) units attached to the polymer backbone. As discussed below, the additive material may be provided in photoresist (negative or positive) material.

The additive material may improve the photolithography process by providing an upper layer or region of the target photosensitive layer that assists to "erase" the unwanted printing of the scattering bars such as described above with reference to FIG. 1. For example, after deposition, the additive material forms an upper layer or region the photosensitive layer that has a decreased sensitivity to exposure. In an embodiment, the properties of the additive material allow the layer or region provided to be disposed at and/or move such that a layer of the additive material is formed at the top of the photosensitive material, as discussed below with reference to block 208. In other words, the properties of polymer of the additive material allow it to "float" to the top of the photoresist layer. The floating may be provided by a floatable component or unit attached to a polymer chain of the additive material. As stated, the additive material also provides one of an acid component or a base component, for example, also attached to the polymer chain. The acid component can generate an acid after exposure to a radiation and/or thermal treatment. The base component can generate a base after exposure to a radiation and/or thermal treatment. The released acid or base can be distributed only in the additive layer region, which is above the photoresist layer.

The additive material is now described in further detail. As discussed above, the additive material includes a polymer having a floatable unit and one of an acid or base component. The floatable unit and acid/base component are bonded together by a polymer backbone.

FIG. 4 illustrates an additive material 400 having a polymer chain 402 with a floatable unit 404 and a base unit 406 bonded thereto. In an embodiment, the groups bonded to the polymer chain 402 include approximately 50% floatable units 404 and approximately 50% base units 406. However, other distributions may be possible. The percentage of base units 406 and/or floatable units 404 may provide control of the "floatability" and the performance (e.g., in "erasing" unwanted exposure) of the additive material. In an embodiment, other functional groups, in addition to the floatable unit 404 and base unit 406, could be bonded to the polymer chain 402. The additive material 400 may be a copolymer, blended polymer, or other polymer type. In an emobodiment, the additive material 400 is provided in a positive-tone resist.

FIG. 5 illustrates an additive material 500 having a polymer chain 402 with a floatable unit 404 and an acid unit 502 bonded thereto. In an embodiment, the groups bonded to the polymer chain 402 include approximately 50% floatable unit 404 and approximately 50% acid unit 502. However, other distributions may be possible. The percentage of acid units 502 and/or floatable units 404 may provide control of the "floatability" and the performance (e.g., in "erasing" unwanted exposure) of the additive material. In an embodiment, other functional groups, in addition to the floatable unit 404 and acid unit 502, could be bonded to the polymer chain 402. The additive material 500 may be a copolymer, blended polymer, or other polymer type. In an embodiment, the additive material 500 is provided in a negative-tone resist.

Figure 9:
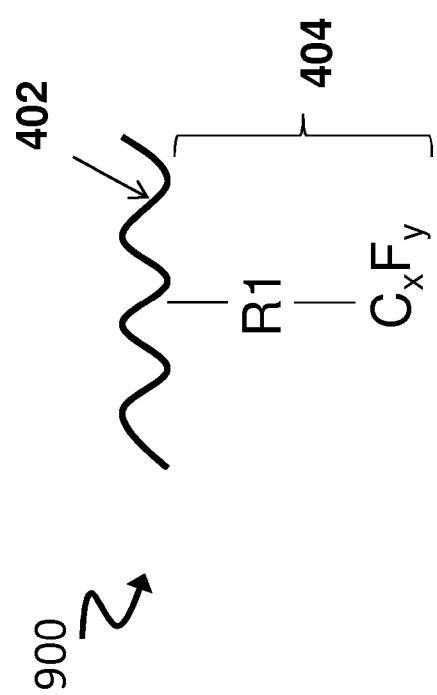
FIGS. 9, 10 and 11 are diagrammatic views of portions of polymers prepared in accordance with some embodiments.

The components of the additive material including those of FIGS. 4 and 5 now discussed in greater detail. Illustrated in FIG. 9 is an example of a floatable unit 404 attached to the polymer 402 illustrated as component 900. The polymer chain 402 may be PHS (such as PHS polymers by DuPont™), acrylate, a 1-10 carbon unit, and/or other suitable polymer chain. A $C_xF_y$ unit is bonded to the polymer chain 402. The $C_xF_y$ may provide the "floating" properties of the additive material, such as the additive material 400 of FIG. 4 of the additive material 500 of FIG. 5. The $C_xF_y$ component may be a chain or branched unit. The number of carbons may be between one (1) and nine (9), including 1 and 9.

An R1 component may connect the CxFy component to the polymer chain 402. In other embodiments, the R1 component is omitted and the CxFy component is connected directly to the polymer chain 402. The R1 unit may be unbranched or branched, cyclic or noncyclic, saturated 1~9 carbon unit with hydrogen or halogen (e.g., alkyl, alkene), or —S—; —P—; —P($O_2$)—; —C(=O)S—; —C(=O)O—; —O—; —N—; —C(=O)N—; —$SO_2$O—; —$SO_2$O—; —$SO_2$S—; —SO— —$SO_2$—, carboxylic acid, ether, ketone, ester unit and/or other suitable components.

Exemplary floating unit 404 components include each of the following:

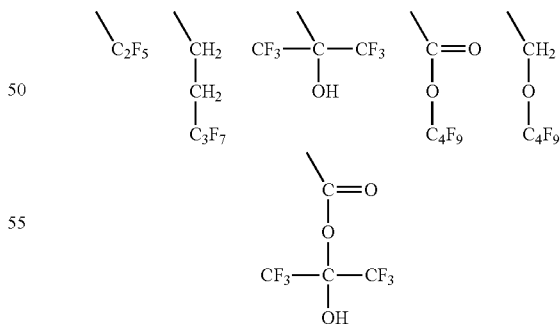

Figure 10:
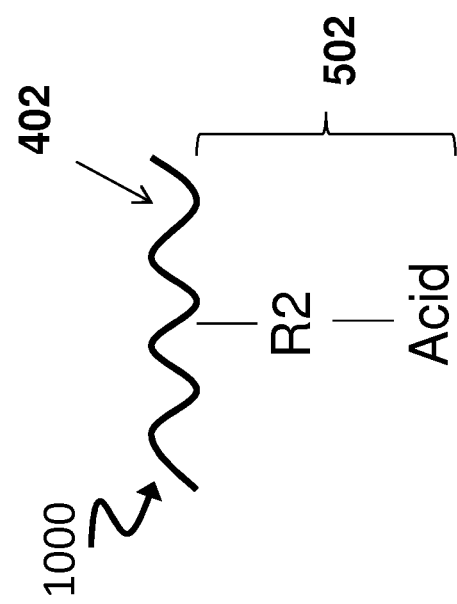

Illustrated in FIG. 10 is an example of an acid unit 502 attached to the polymer 402 illustrated as component 1000. The polymer chain 402 may be PHS, acrylate, a 1-10 carbon unit, and/or other suitable polymer chain. An acid 502 unit is bonded to the polymer chain 402. The acid 502 may provide the properties of the additive material such as to reduce the exposure of unwanted features in the accompanying negative-tone resist. The component 1000 may be a portion of the additive material 500 of FIG. 5.

The R2 component may connect the acid unit with the polymer chain 402. In other embodiments, the R2 component is omitted and the acid unit is connected directly to the polymer chain 402. The R2 unit may be unbranched or branched, cyclic or noncyclic, saturated 1~9 carbon unit with hydrogen or halogen (e.g., alkyl, alkene), or —S—; —P—; —P(O₂)—; —C(═O)S—; —C(═O)O—; —O—; —N—; —C(═O)N—; —SO₂O—; —SO₂O—; —SO₂S—; —SO— —SO₂—, carboxylic acid, ether, ketone, ester unit, and/or other suitable component to connect the acid and the polymer chain 402.

Examples of the acid of the acid unit 502 may include a photoactive component (PAC), a photoacid generator (PAG), and/or a thermal acid generator (TAG). The acid may composed of a cation and/or anion. The acid may diffuse around the additive layer after thermal and/or radiation exposure.

Exemplary acid units 502 components include each of the following:

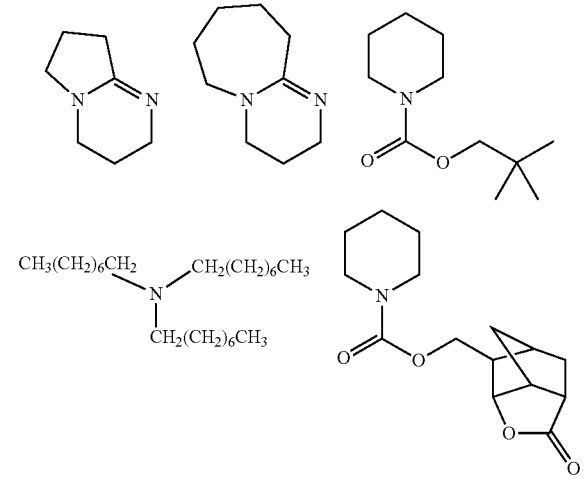

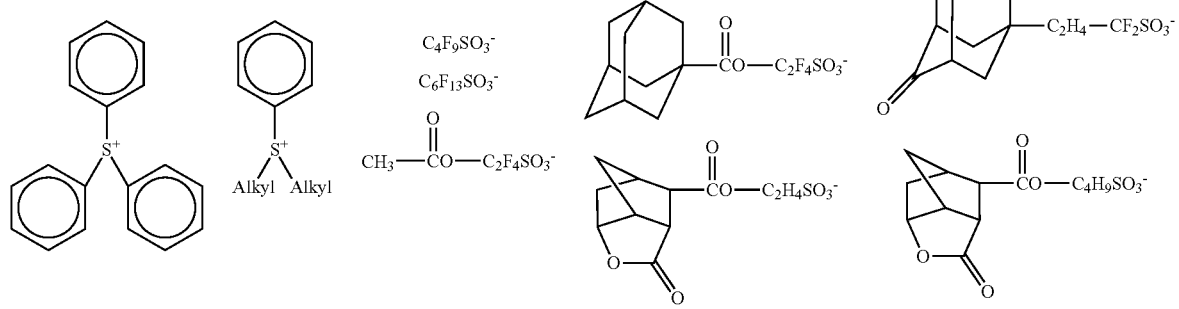

Figure 11:
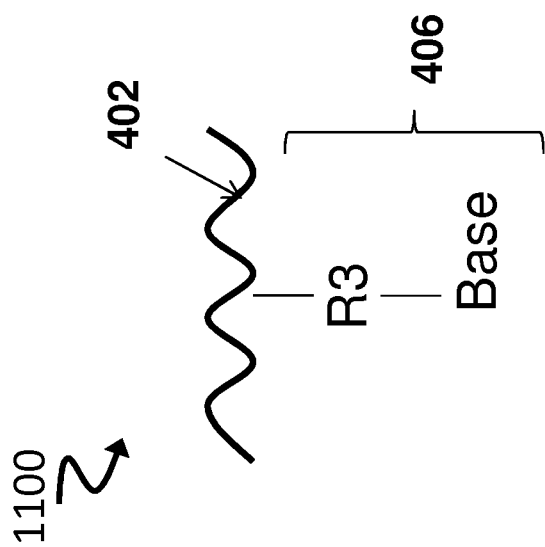

Illustrated in FIG. 11 is an example of a base unit 406 attached to the polymer 402 illustrated as component 1100. The polymer chain 402 may be PHS, acrylate, a 1-10 carbon unit, and/or other suitable polymer chain. A base unit 406 is bonded to the polymer chain 402. The base may provide the properties of the additive material such as to reduce the exposure of unwanted features in the accompanying positive-tone resist. The component 1100 may be a portion of the additive material 400 of FIG. 4.

The R3 component may connect the acid unit with the polymer chain 402. In other embodiments, the R3 component is omitted and the base is connected directly to the polymer chain 402. The R3 unit may be unbranched or branched, cyclic or noncyclic, saturated 1~9 carbon unit with hydrogen or halogen (e.g., alkyl, alkene), or —S—; —P—; —P(O₂)—; —C(═O)S—; —C(═O)O—; —O—; —N—; —C(═O)N—; —SO₂O—; —SO₂O—; —SO₂S—; —SO— —SO₂—, carboxylic acid, ether, ketone, ester unit, and/or other suitable component to connect the base and the polymer chain 402.

Examples of the base of the base unit 406 may include quencher or photo decompose base (PDB), thermal decompose base (TDB). After exposure of the additive material including the component 1100, the base would diffuse around the additive material layer.

Exemplary base unit 406 components include each of the following:

As discussed below, the present disclosure provides embodiments where the additive material 400, including base units 406, is added to and/or deposited onto a positive-tone photosensitive layer. Thus, the base of the additive material decreases the photoacid reaction of the positive-tone resist. The present disclosure also provides embodiments where the additive material 500, including acid units 502, is added to and/or deposited onto a negative-tone photosensitive layer. Thus, the acid of the additive decreases the production of the base in the negative-tone resist. Whether added to the photoresist, deposited on the photoresist, or mixed with and deposited onto another photoresist layer, the additive material can form a layer or region on the substrate with a photoresist layer or region underlying it with these properties (e.g., decrease of photoacid reaction of a positive resist or decrease production of a base in negative resist).

In certain embodiments, the additive material and photosensitive material, discussed above in block 204, are mixed prior to depositing on a substrate. In an embodiment, the percentage of additive material to photosensitive material is approximately 2 percent to approximately 10 percent. In an embodiment, the percentage of additive material to photosensitive material is approximately 5 percent. In an embodiment, the approximate percentage is the additive material in photosensitive material is the percentage at deposition. The percentage additive material may provide control of the thickness and/or the performance (e.g., in "erasing" unwanted exposure) of the additive material.

In an embodiment, the material including the mixture of the photosensitive material (e.g., negative or positive resist) and the additive material is formed by copolymerization of the components. In other words, the additive is a copolymer of the resist material. The additive may be a periodic copolymer, alternating copolymer, statistical copolymer, block copolymer, and/or other suitable types of copolymers. The copolymer may be linear or branched. The photosensitive material and additive material may be provided in a solvent. On application to the substrate, the additive material may "float" and provide an upper region of the deposited layer.

In another embodiment, the material including the photosensitive material (e.g., negative or positive resist) and the additive material is formed as a blending polymer (or polymer blend). In other words, the additive and the resist material are a polymer blend. The polymer blend may be a heterogeneous or homogeneous blend. On application to the substrate, the additive material may "float" and provide an upper region of the deposited layer.

In yet another embodiment, a first photosensitive material using conventional resist is prepared (and coated on the target as discussed below). A material including the additive material is then formed on the substrate. In an embodiment, the separately prepared additive material also includes photosensitive material. For example, the additive 400 is mixed with a positive-tone resist. As another example, the additive 500 is mixed with a negative-tone resist. In an embodiment as discussed above, the additive may be between approximately 1 and approximately 10 percent; for example, approximately 5% additive to photosensitive material. In this embodiment, the percentage of the floatable component on the polymer chain of the additive material may be decreased or the floatable component eliminated.

The method 200 then proceeds to block 208 where the photoresist and additive material are formed on the target substrate. In an embodiment, the photoresist and/or additive material are formed on the target substrate by a spin-on coating process. The photoresist material and additive material may be deposited simultaneously. For example, in an embodiment, the additive material is mixed with the photoresist material as discussed above with reference to block 206 such as, for example, as a copolymer or blending polymer. In other embodiments, the photoresist material may be first formed on the target substrate and the additive material subsequently formed on the layer of photoresist material. In an embodiment, the additive material and photoresist material are deposited sequentially with no processes interposing the deposition of the photoresist material and additive material.

Figure 3:
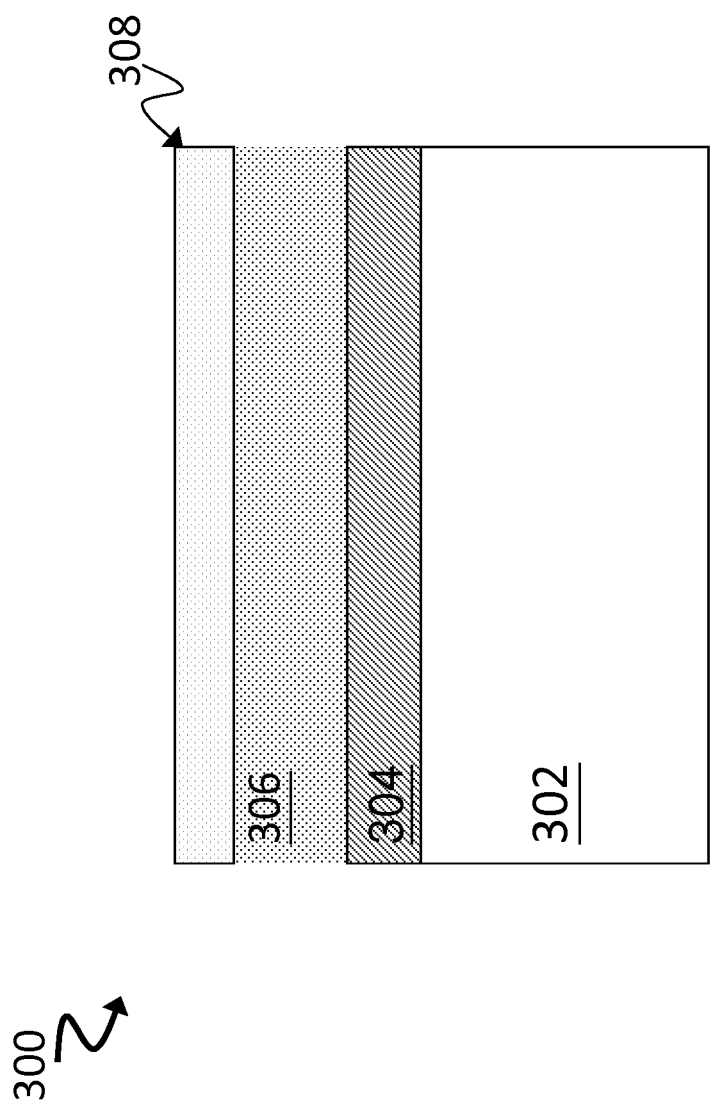
FIG. 3 is a cross sectional view of an embodiment of a substrate having a photosensitive material layer and an additive layer in accordance with some embodiments.

Referring to the example of FIG. 3, a photoresist layer 306 and an additive layer 308 are illustrated as disposed on the substrate 302. The photoresist layer 306 may be substantially similar to the photosensitive material discussed above with reference to block 204. The additive layer 308 includes an additive material, as discussed above with reference to block 206. In an embodiment, the additive layer 308 also includes a photosensitive material of the same type or tone as the photoresist layer 306. Referring to the example of the device 300, in an embodiment, the photoresist material 306 is a positive-tone resist and the additive layer 308 includes an additive material having a base component, such as the additive component 400 illustrated above in FIG. 4. In another embodiment of the device 300, the photoresist material 306 is a negative-tone resist and the additive layer 308 includes an additive material having an acid component, such as the additive component 500 illustrated in FIG. 5. The photoresist layer 306 and/or the additive layer 308 may be formed by suitable deposition processes such as spin-on coating. The photoresist layer 306 may be formed in the same or separate process as the additive layer 308. In an embodiment, the materials of layers 306 and 308 are deposited simultaneously and the layer 308 is formed by the "floating" of the additive material to an upper region thus, forming layer 308. In an embodiment, the layer 308 includes approximately 5% additive material.

The immersion lithography method 200 proceeds to block 210, where an exposure process is performed on the substrate having the photoresist material layer. Referring to FIG. 6, illustrated is a photolithography system 600. The photolithography system 600 includes a photomask 102 having opaque region 602 for blocking incident radiation. A radiation beam 108 is provided through the photomask 102. The photolithography system 100 further includes the target substrate 300, described above with reference to FIG. 3. These exemplary embodiments, including the photomask 102, do not imply that any portion of the present disclosure is directed to a certain photolithography manner other than if specifically recited in the claims that follow. For example, though the photolithography system 600 illustrates a photomask having binary materials, there is no implication that the materials and methods discussed herein are limited to UV radiation, but may apply to e-beam lithography, other photomask types, immersion lithography, and/or other suitable methods.

The photomask 102 may include silica, fused quartz, calcium fluoride (CAF2), silicon carbide, silicon oxide-titanium oxide alloy or other suitable material known in the art. The opaque layer 602 may be a reflective, aborption, or opaque layer or multi-layer feature to pattern an incident radiation beam. The opaque layer 602 may include chromium (Cr), chromium oxide (CrO), titanium nitride (TiN), tantalum nitride (TaN), tantalum (Ta), titanium (Ti), aluminum copper (Al—Cu), palladium, tantalum boron nitride (TaBN), aluminum oxide (AlO), molybdenum (Mo) including Mo pained with silicon or beryllium, ruthenium and ruthenium compounds, and/or other suitable materials.

Radiation 108 may be an ultraviolet light source, for example deep ultra-violet: a krypton fluoride (KrF, 248 nm), argon fluoride (ArF, 193 nm), F2 (157 nm), and extreme ultra-violet (EUV, 13.5 nm). The radiation is incident the photomask 102 and patterned by the photomask 102 and features formed thereon to form the patterned radiation beam 108, which is incident the target substrate 300. The patterned beam provides an exposure pattern on the photoresist layer 306 and/or the additive layer 308. Specifically, in FIG. 6 the exposed portions 306b are denoted and the unexposed portions 306 are denoted.

The method 200 then proceeds to block 212 where the substrate with the exposed resist is heated with a baking process such as a post-exposure bake (PEB). The PEB may be beneficial for polymer dissolution. For example, the bake may allow any generated photo acid (or base) react with the polymer and facilitate the polymer dissolution to pattern the resist.

The method 800 then proceeds to block 214, where a pattern developing process is performed on the exposed (in the case of positive tone) or unexposed (in the case of negative tone) resist to leave a desired mask pattern. The substrate is immersed in a developer liquid for a predetermined amount of time during which a portion of the resist is dissolved and removed. A separate, additional rinse may also be applied. The composition of the developer solution is dependent on the composition of the resist. A base solution of 2.38% tetramethyl ammonium hydroxide (TMAH) is one example of a developer solution for a positive-tone resist. Additionally, n-butyl acetate (nBA), 2-heptanone, methyl isobutyl carbinol (MIBC) are examples of developer solutions for negative-tone resist. The development process may form a pattern in the resist which can be used as a masking element for further processing of the substrate, such as forming a semiconductor device feature or portion thereof. In block 214, portions of the additive layer, which includes photoresist and the additive material, are also removed by the developer solution.

Figure 7:
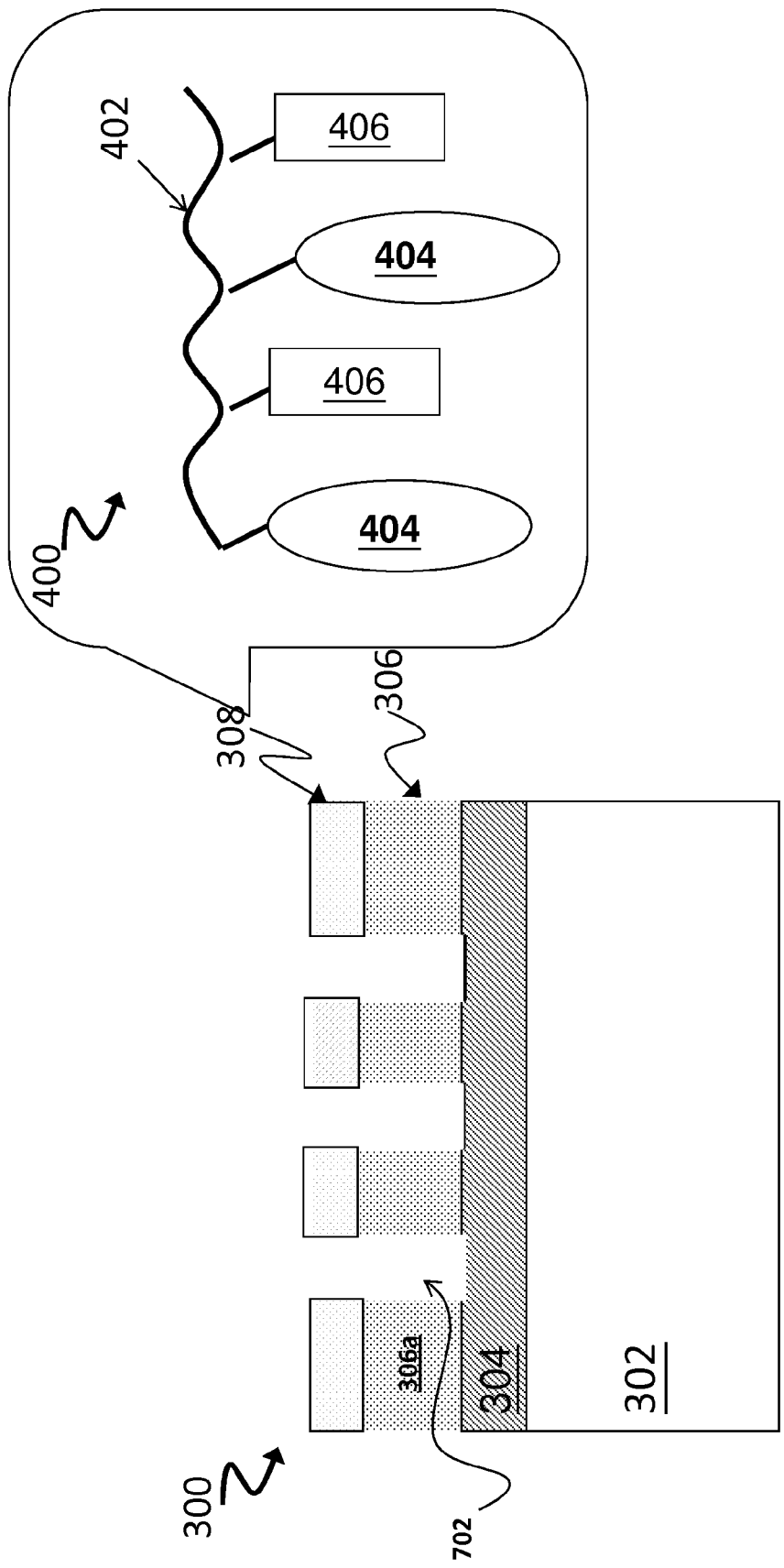
FIGS. 7 and 8 are cross sectional views of a substrate after the photolithography process of FIG. 6 in accordance with some embodiments.

Referring to the example of FIG. 7, illustrated is the device 300 after exposure (such as illustrated in FIG. 6) and development processes, where the photosensitive layer 306 is a positive resist. As illustrated in FIG. 7, the exposed regions of the photoresist (see region 306b of FIG. 6) have been removed from the substrate 302 by a developer solution. This leaves patterned openings 702. Corresponding portions of the overlying additive layer 308 have also been removed. As illustrated in FIG. 7, the additive layer 308 includes an additive material having the composition 400, described above with reference to FIG. 4. Specifically, the additive layer 308 includes a polymer 402 having a plurality of base units 406 and floatable units 404 attached to the polymer 402, as described above with reference to FIG. 4. In an embodiment, scattering bars are not printed onto the substrate, layer as discussed above with reference to FIG. 1, due to the mitigation of the printing affects provided by the additive.

Figure 8:
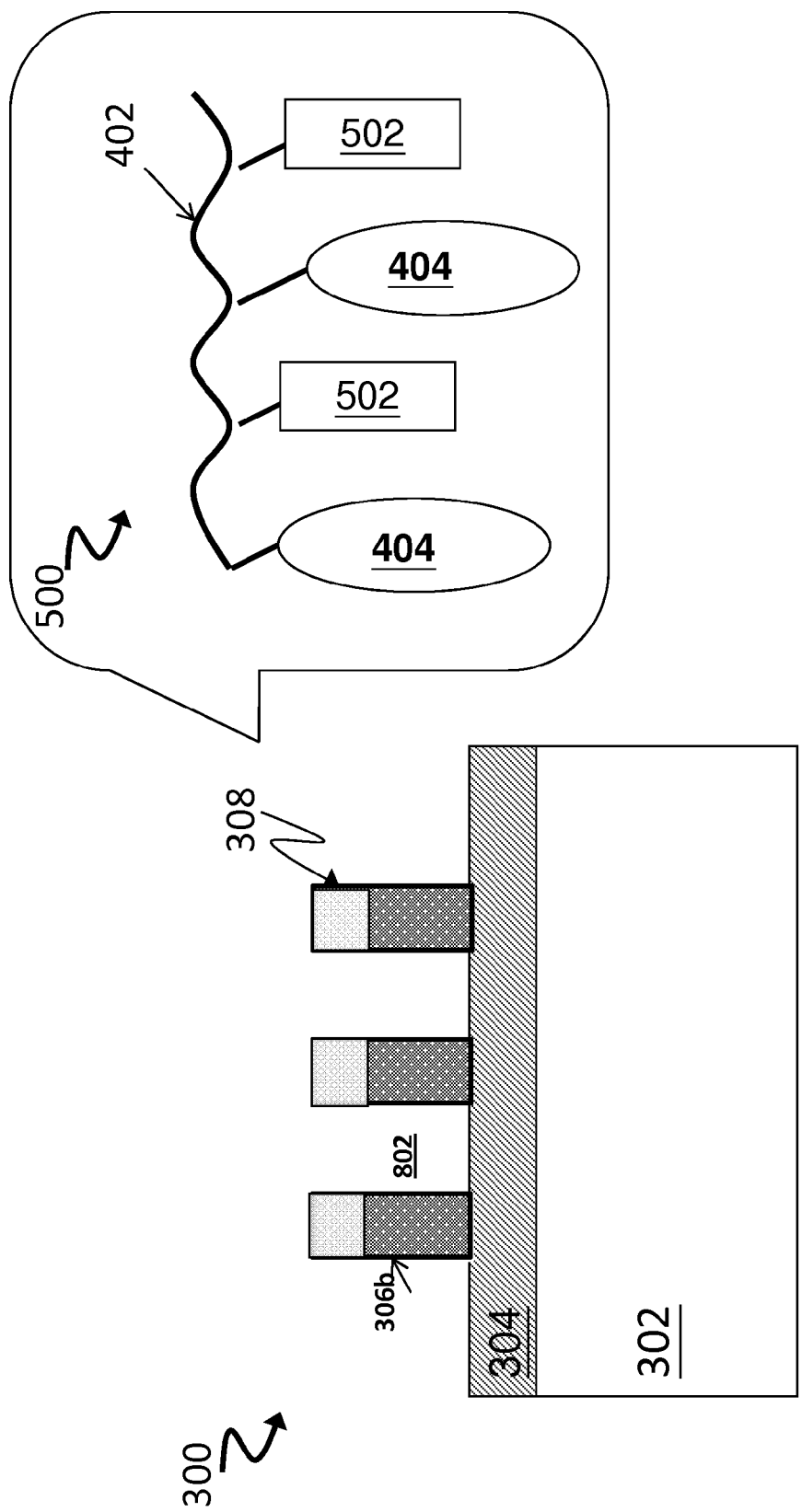

Referring to the example of FIG. 8, illustrated is the device 300 after exposure (such as illustrated in FIG. 6) and development processes, where the photosensitive layer 306 is a negative resist. As illustrated in FIG. 8, the exposed regions of the negative photoresist (see region 306a of FIG. 6) have been removed from the substrate 302 by a developer solution. This leaves patterned openings 802 between the exposed portions 306b of the photosensitive layer 306. Corresponding portions of the overlying additive layer 308 have also been removed. As illustrated in FIG. 8, the additive layer 308 includes the composition 500, described above with reference to FIG. 5. Specifically, the additive layer 308 includes a polymer 402 having a plurality of acid units 502 and floatable units 404 attached to the polymer 402, as described above with reference to FIG. 5.

The method 200 may proceed to rinsing, drying, and/or other suitable processes. The patterned photosensitive layer may, alone or in combination, be used as a masking element in performing one or more processes on underlying layers such as etching, ion implantation, deposition, and/or other suitable processes including those typical of a CMOS-compatible process. The photosensitive material layer may be subsequently stripped from the substrate.

Thus, in one embodiment, provided is a method that includes selecting a photoresist. The photoresist selected is one of a positive-tone photoresist and a negative-tone photoresist. An additive material is then selected. The additive material is one of a first additive and a second additive. The first additive has a fluorine component and a base component attached to a polymer. The second additive has the fluorine component and an acid component attached to the polymer. The first additive is selected if the selecting the photoresist included selecting the positive-tone resist. The second additive is selected if the selecting the photoresist included selecting the negative-tone resist. The selected photoresist and the selected additive material are applied to a target substrate.

In another of the embodiments, described is a method of semiconductor device fabrication that includes forming a photosensitive layer on a target substrate. An additive layer is formed on the photosensitive layer; the additive layer includes an additive material. The additive material includes a polymer having a fluorine unit and one of a base unit and an acid unit. The photosensitive layer includes the other one of the base unit and the acid unit. (For example, in an embodiment the photosensitive layer is a positive-resist including an acid that is activated by the exposure and the additive material includes a base component. As another example, in an embodiment the photosensitive material is a negative-resist including a base that is activated by the exposure and the additive material includes an acid component.) In the method, the target substrate having the photosensitive layer and additive layer disposed thereon is then exposed to form an exposed region and an unexposed region of the photosensitive layer and the additive layer. The target substrate is developed after the exposing such that one of the exposed region and the unexposed region is removed from the target substrate.

In yet another embodiment, described is a photolithography material. The material includes a positive-tone photoresist and an additive material mixed with the positive-tone photoresist. The additive material includes a polymer chain having a fluorine component and a base component bonded to the polymer chain.

In yet another embodiment, described is a photolithography material. The material includes a negative-tone photoresist and an additive material mixed with the negative-tone photoresist. The additive material includes a polymer chain having a fluorine component and an acid component bonded to the polymer chain.

Thus, provided are embodiments of photolithography material having an additive material that "erases" unwanted features by in affect decreasing the sensitivity of an upper layer or region of the photosensitive layer formed. The additive material is provided such that it "floats" to a top region of the photosensitive layer (or it is separately deposited on the photosensitive layer). The The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
providing a photoresist, wherein the photoresist is one of a positive-tone photoresist and a negative-tone photoresist;
selecting an additive material, wherein the additive material is one of a first additive and a second additive, wherein the first additive has a fluorine component attached to a first position of a polymer chain and a base component attached to a second position of the polymer chain, wherein the base component is one of a quencher and a thermal decompose base (TDB); wherein the second additive has the fluorine component attached to a third location of a second polymer chain and an acid component attached to a fourth location of the second polymer chain, wherein the acid component is a photoacid generator, wherein the selecting the additive includes:

selecting the first additive if the providing the photoresist included providing the positive-tone resist and selecting the second additive if the providing the photoresist included selecting the negative-tone resist; and applying the provided photoresist and the selected additive material to a target substrate.

2. The method of claim 1, further comprising:

mixing the provided photoresist and the selected additive material prior to applying the provided photoresist and the selective additive material to the target substrate.

3. The method of claim 2, wherein the mixing includes providing a copolymer of the provided photoresist and the selected additive material.

4. The method of claim 2, wherein the mixing includes providing a blending polymer of the provided photoresist and the selected additive material.

5. The method of claim 1, wherein properties of the additive material cause floating the applied additive material to a top region of the applied photoresist when applied to the target substrate.

6. The method of claim 1, wherein the provided photoresist is positive-tone and the selected additive material is the first additive, and wherein the base component is one of:

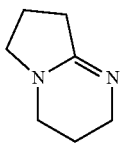
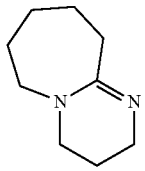

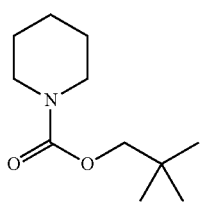
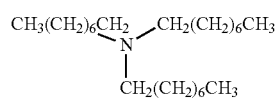

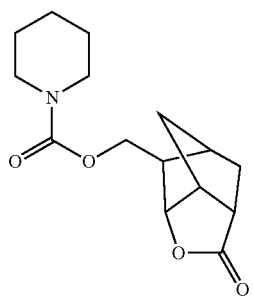

7. The method of claim 1, wherein the provided photoresist is negative-tone and the selected additive material is the second additive, and wherein the acid component is one of:

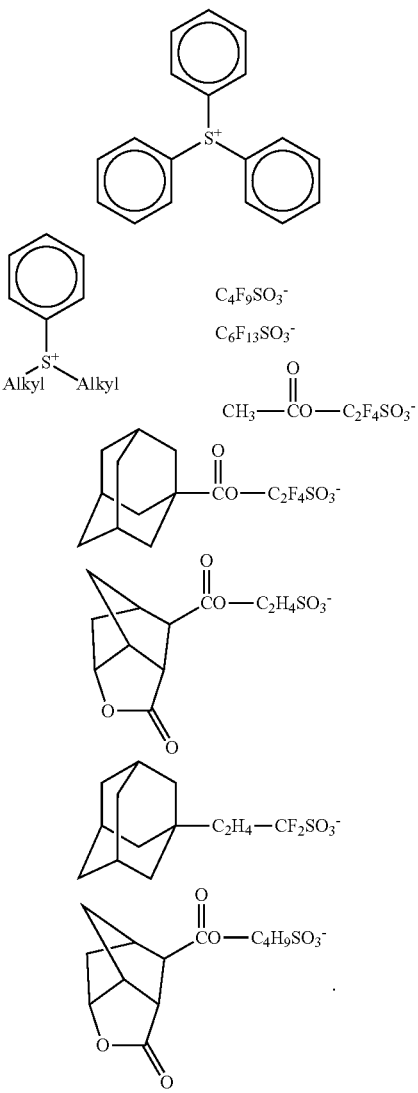

8. The method of claim 1, wherein the selecting the additive material includes providing the first additive having the base component attached to the second carbon by a component selected from the group consisting of: a 1~9 carbon unit with hydrogen or halogen, —S—; —P—; —P(O$_2$)—; —C(=O)S—; —C(=O)O—; —O—; —N—; —C(=O)N—; —SO$_2$O—; —SO$_2$O—; —SO$_2$S—; —SO—SO$_2$—, carboxylic acid, ether, ketone, ester unit, and combinations thereof.

9. A method of semiconductor device fabrication, wherein the method comprises:

forming a photosensitive layer on a target substrate;

forming an additive layer on the photosensitive layer, wherein the additive layer includes an additive material, and wherein the forming the additive layer includes depositing the additive material with the photoresist layer and floating the additive material to a top region of the photosensitive layer to form the additive layer;

wherein the additive material includes a polymer having a fluorine unit and one of a base unit and an acid unit, wherein the fluorine unit provides the floating, and wherein the acid unit is a photoacid generator and the base unit is a photodecompose base; and wherein the photosensitive layer includes the other one of the photodecompose base and the photoacid generator;

exposing the target substrate having the photosensitive layer and additive layer disposed thereon to form an exposed region and an unexposed region of the photosensitive layer and the additive layer; and developing the target substrate after the exposing such that one of the exposed region and the unexposed region is removed from the target substrate.

10. The method of claim 9, wherein the forming the photosensitive layer includes depositing a positive-tone photoresist and wherein the additive material includes the photobase generator.

11. The method of claim 9, wherein the forming the photosensitive layer includes forming a negative-tone photoresist and wherein the additive material includes the photoacid generator.

12. The method of claim 9, wherein the forming the photosensitive layer is performed in a first deposition step and the forming the additive layer is formed in a second deposition step after the first deposition step.

13. The method of claim 9, further comprising: irradiating the provided photosensitive layer and the additive layer with a first radiation beam;

wherein the additive layer has a decreased sensitivity to the first radiation beam in comparison to the underlying photosensitive layer.

14. A method of semiconductor device fabrication, comprising:

providing a photoresist;

selecting an additive material based on a type of the photoresist, wherein a first additive material having each of a fluorine component and a base component attached to a polymer is selected if the photoresist is of a positive type photoresist, and a second additive having each the fluorine component and an acid component attached to the polymer if the photoresist is of a negative type; and applying the provided photoresist and the selected additive material to a target substrate, wherein during the applying the selected additive material form an upper additive layer over a photoresist layer, and wherein the upper additive layer has a decreased sensitivity to radiation than the photoresist layer.

15. The method of claim 14, further comprising:

mixing the provided photoresist and the selected additive material prior to applying the provided photoresist and the selective additive material to the target substrate.

16. The method of claim 15, wherein the mixing includes providing a copolymer of the provided photoresist and the selected additive material.

17. The method of claim 15, wherein the mixing includes providing a blending polymer of the provided photoresist and the selected additive material.

18. The method of claim 14, wherein during the applying the selective additive material to the target substrate, the selective additive material floats to a top region of the applied photoresist.

19. The method of claim 14, wherein the provided photoresist is negative-tone type and the selected additive material is the second additive.

* * * * *